US006642582B1

United States Patent
Libera et al.

(10) Patent No.: US 6,642,582 B1
(45) Date of Patent: Nov. 4, 2003

(54) CIRCUIT STRUCTURE WITH A PARASITIC TRANSISTOR HAVING HIGH THRESHOLD VOLTAGE

(75) Inventors: Giovanna Dalla Libera, Monza (IT); Federico Pio, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/364,023

(22) Filed: Jul. 30, 1999

(30) Foreign Application Priority Data

Jul. 30, 1998 (EP) .............................. 98830461

(51) Int. Cl.⁷ .............................................. H01L 21/28
(52) U.S. Cl. ...................... 257/372; 257/394; 257/401; 257/503; 257/773
(58) Field of Search ................................ 257/372, 394, 257/401, 503, 773; 438/233, 672

(56) References Cited

U.S. PATENT DOCUMENTS

| | | | |
|---|---|---|---|
| 4,872,010 A | * | 10/1989 | Larson et al. |
| 4,951,112 A | * | 8/1990 | Choi et al. |
| 5,714,394 A | * | 2/1998 | Kadosh et al. ............... 438/199 |
| 5,789,791 A | * | 8/1998 | Bergemont |
| 5,945,726 A | * | 8/1999 | Prall et al. ................... 257/565 |
| 6,015,726 A | * | 1/2000 | Yoshida ....................... 438/202 |
| 6,159,844 A | * | 12/2000 | Bothra ......................... 438/637 |

FOREIGN PATENT DOCUMENTS

| | | |
|---|---|---|
| EP | 0 513 639 A2 | 11/1992 |
| JP | 60-57673 | 4/1985 |
| JP | 63-54763 | 3/1988 |
| JP | 7-161824 | 6/1995 |

OTHER PUBLICATIONS

Silicon Processing for the VLSI Era, vol. 2, Wolf S., 1990 by Lattice Press, pp. 144–147 and 623–628.*
European Patent Abstract of Japanese Publication No. 60057673, published Apr. 3, 1985.
European Patent Abstract of Japanese Publication No. 63054763, published Mar. 9, 1988.
European Patent Abstract of Japanese Publication No. 07161824, published Jun. 23, 1995.
European Search Report dated Dec. 8, 1998, with annex on European Application No. EP 98 83 0461.

* cited by examiner

Primary Examiner—George Fourson
Assistant Examiner—Michelle Estrada
(74) Attorney, Agent, or Firm—Lisa K. Jorgenson; Stephen Bongini; Fleit, Kain, Gibbons, Gutman & Bongini P.L.

(57) ABSTRACT

A circuit structure integrated in a semiconductor substrate comprises at least one pair of transistors each being formed each in a respective active area region and having a source region and a drain region, as well as a channel region intervening between the source and drain regions and being overlaid by a gate region. The gate regions are connected electrically together by an overlying conductive layer and respective contacts. The contacts between the gate regions and the conductive layer are formed above the active areas.

23 Claims, 4 Drawing Sheets

CIRCUIT STRUCTURE WITH A PARASITIC TRANSISTOR HAVING HIGH THRESHOLD VOLTAGE

CROSS-REFERENCE TO RELATED APPLICATIONS

This patent application is a United States counterpart to and claims the benefit of the priority date of European Patent Application No. 98830461.4 filed on Jul. 30, 1998, which is hereby incorporated by reference.

FIELD OF THE INVENTION

This invention relates to a semiconductor circuit structure comprising a parasitic transistor with a very high threshold voltage.

BACKGROUND OF THE INVENTION

As is well known, the need to have an ever larger number of devices integrated in one chip has led to a significant reduction in the thickness of the field and isolation oxides which define the active areas of devices provided in the chip.

More generally, during the fabrication process of different devices, successive oxide removing steps are to be carried out in order to produce oxide layers having different thicknesses. This requirement becomes more difficult to meet where transistors capable of standing high voltages are to be provided on the same chip which accommodates low voltage transistors.

Such successive oxide layer-removing steps also affect the isolation oxide layers. This results in further thinning of the thick (isolation) oxides, and attendant lowering of the threshold voltage of the parasitic transistors which form between adjacent devices. Such lowering is often undesirable. Therefore, there is a need for a circuit structure that overcomes these shortcomings in the prior art.

SUMMARY OF THE INVENTION

Briefly, according to the invention, a circuit structure integrated in a semiconductor substrate comprises at least one pair of transistors, each formed in a respective active area region of the semiconductor substrate. Each transistor has a source region, a drain region, and a channel region located between the source and drain regions and being overlaid by a gate region. The gate regions of the transistor pair are connected electrically together by an overlying conductive layer and respective contacts, wherein the contacts between the gate regions and the conductive layer are formed above the active areas.

DETAILED DESCRIPTION OF PREFERRED EMBODIMENTS

Preferred embodiments of the present invention will be described in detail hereinbelow with reference to the attached drawings.

The invention specifically relates to a circuit structure integrated in a semiconductor substrate comprising at least one pair of transistors formed each in a respective active area region and having a source region and a drain region, as well as a channel region intervening between said source and drain regions and being overlaid by a gate region; said gate regions of the transistor pair being connected electrically together by an overlying conductive layer and respective contacts.

The invention is, particularly but not exclusively, directed to a circuit structure which is formed with CMOS technology and has a parasitic transistor associated therewith having a fairly high threshold voltage, and reference will be made in the ensuing description to this field of application for convenience of illustration.

Figure 1:
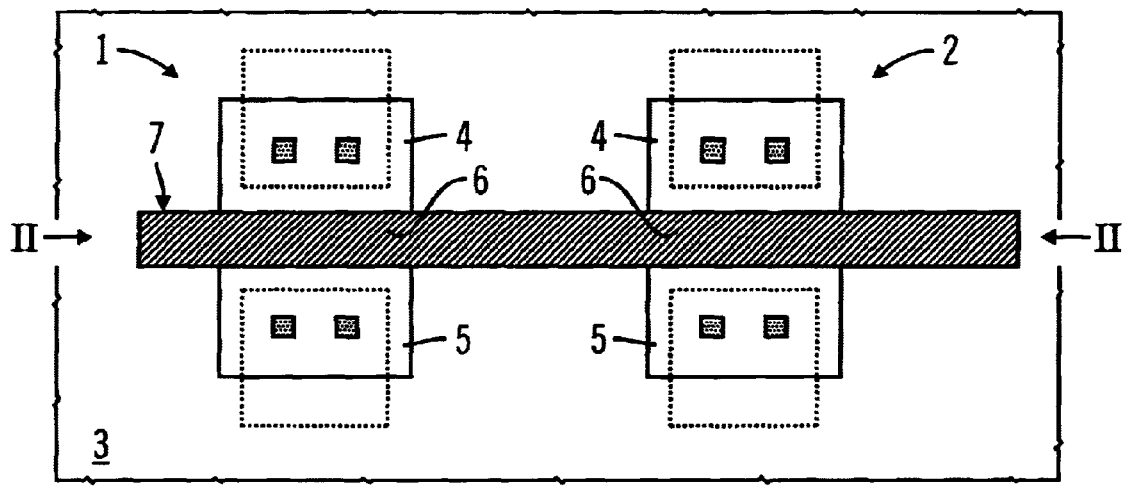
FIG. 1 is an enlarged top plan view showing schematically a portion of a semiconductor wherein a first embodiment of a prior art circuit structure has been formed.

FIG. 1 is a top plan view of a chip portion wherein a circuit structure comprising two MOS transistors 1, 2 is integrated in a conductive substrate 3. These transistors each comprise a source region 4, a drain region 5, and a gate region 6 formed from a common polysilicon line 7. These source 4 and drain 5 regions are separated by a channel region 8 (shown in FIG. 2) wherein charges accumulate in operation of the two transistors 1 and 2.

Figure 2:
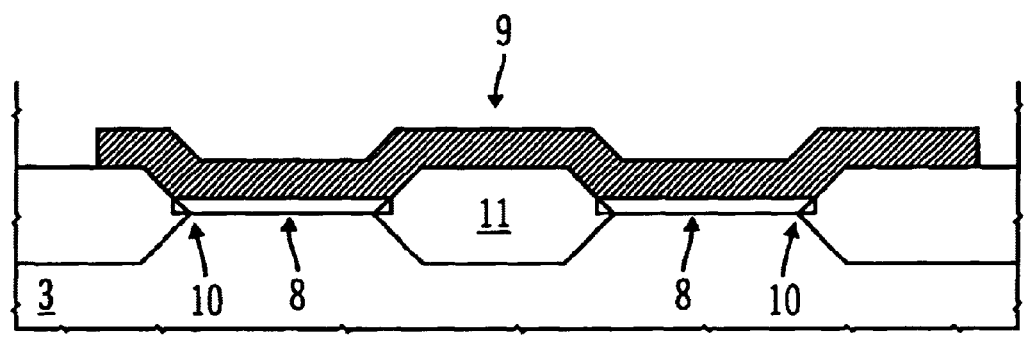
FIG. 2 is an enlarged vertical cross-section view, taken along line 11—11 in FIG. 1, showing schematically the first embodiment of a prior art circuit structure.

As more clearly shown in FIG. 2, a parasitic transistor 9 is formed in the substrate 3 for which the channel regions of the transistors 1, 2 function as the source and drain regions 10, the isolation oxide between the two transistors functions as the gate oxide 11, and the polysilicon line 7 as the gate region. The threshold of this parasitic transistor 9 decreases with the thickness of the isolation oxide 11, the reduction in thickness being, as mentioned, a consequence of the repeated steps of oxide layer removal. As the charges increase under the isolation oxide 11, a channel region is created, and the parasitic transistor 9 is turned on. This results in an undesired current dissipation in operation of the transistors 1 and 2.

A first prior approach to preventing the parasitic transistor 9 from being turned on, provides isolation implants under the isolation oxide 11. Although in many ways advantageous, this prior solution has some drawbacks. The provision of isolation implants leads to an undesired decrease of the breakdown voltage between the active area accommodating the source and drain regions, on the one side, and the substrate, on the other side.

Figure 3:
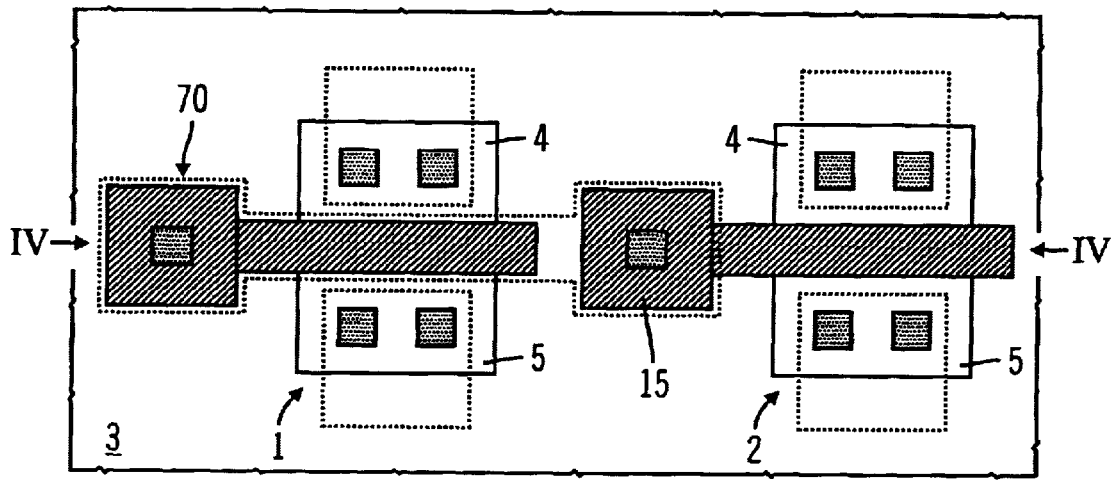
FIG. 3 is an enlarged top plan view showing schematically a portion of a semiconductor wherein a second embodiment of a prior art circuit structure has been formed.
Figure 4:
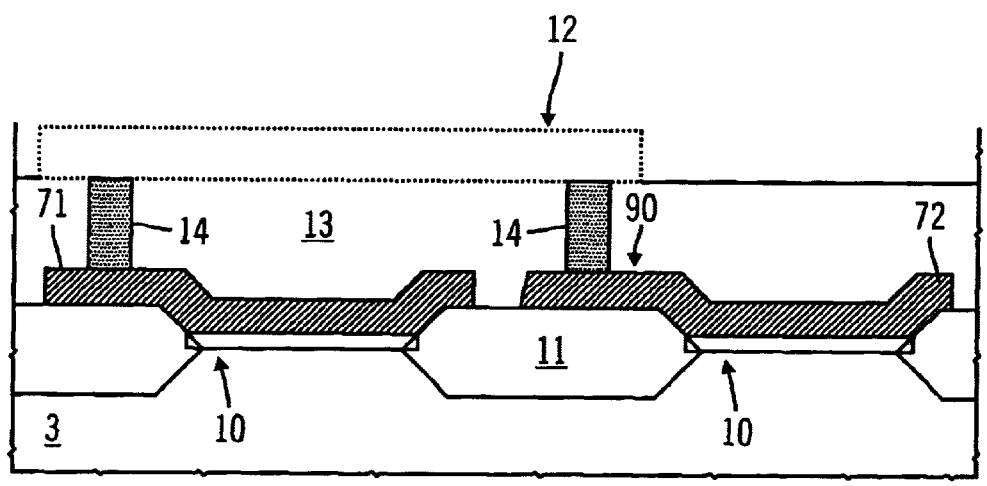
FIG. 4 is an enlarged vertical cross-section view, taken along line IV—IV in FIG. 3, showing schematically the second embodiment of a prior art circuit structure.

A second embodiment is shown in FIG. 3. Elements having the same construction and function are referenced same as in the previous embodiment. This second structure comprises two MOS transistors 1 and 2 formed on a conductive substrate 3, each having a source region 4, drain region 5, and gate region 6 formed from a polysilicon line 70 which is interrupted at the thick oxide region 11 (FIG. 4). This break divides the line 70 into two sections 71, 72.

To provide electrical continuity between the sections 71, 72 produced by dividing the polysilicon line 70, metal contacts 14 are formed on an intermediate oxide layer 13 which isolates the polysilicon layer 70 from an overlying conductive layer 12. In the state of the art, these contacts 14 are open at the isolation oxide 11. This prior embodiment results in an undesired connection being established between the channels of the transistors 1, 2 when a channel is formed under the isolation oxide 11. Thus, a parasitic transistor 90 is created for which the channel regions of the transistors 1, 2 function as the source and drain regions 10, the isolation oxide between the two transistors functions as the gate oxide, and the polysilicon line 70 and conductive layer 12 function as the gate region. While achieving its objective, in that by increasing the thickness of the gate oxide of the parasitic transistor 90 the threshold voltage of the latter is raised, not even this solution is devoid of drawbacks.

In fact, to form the contacts 14 between the line 70 and the conductive layer 12, a polysilicon pad 15 is to be provided wherein the contact 14 can be formed, as shown in FIG. 3. This pad 15 must have appropriate dimensions to accommodate the alignment tolerances of the masks involved in forming the contacts within the isolation oxide region 11. This requires a significant amount of chip space, especially when the minute size of transistors formed with modern technologies is considered.

The underlying technical problem of this invention is to provide a circuit structure which comprises at least two MOS transistors having a very high threshold voltage, parasitic transistor associated therewith. This structure should have such constructional and functional features as to allow of very high on-chip integration and overcome the limitations and/or drawbacks which still beset the prior proposals.

The solution on which the present invention is based is to provide a circuit structure including at least two field-effect transistors whose gate regions are connected electrically together by means of contacts which are open above the gate regions.

Based on this concept, the technical problem is solved by a circuit structure of contacts as previously indicated. The problem is also solved by a process for forming the circuit structure contacts, as previously indicated. The features and advantages of a circuit structure according to the invention will be apparent from the following description of an embodiment thereof, given by way of non-limiting example with reference to the accompanying drawings.

Figure 5:
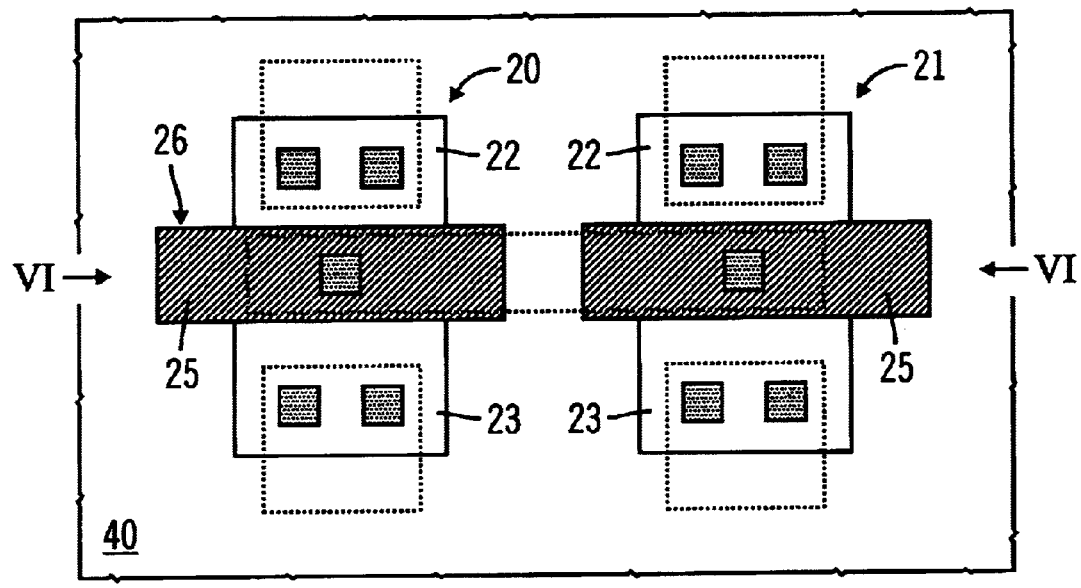
FIG. 5 is an enlarged top plan view showing schematically a portion of a semiconductor wherein a first embodiment of the circuit structure according to the invention has been formed.

Referring in particular to the example of FIG. 5, a circuit structure 50 according to the invention will now be described which is integrated in a semiconductor substrate 40 doped with a first dopant type, e.g. of the P type, and includes at least one pair of transistors 20, 21. These transistors 20, 21 are formed in respective active areas 30 which are delimited by an isolation oxide layer 27.

Figure 6:
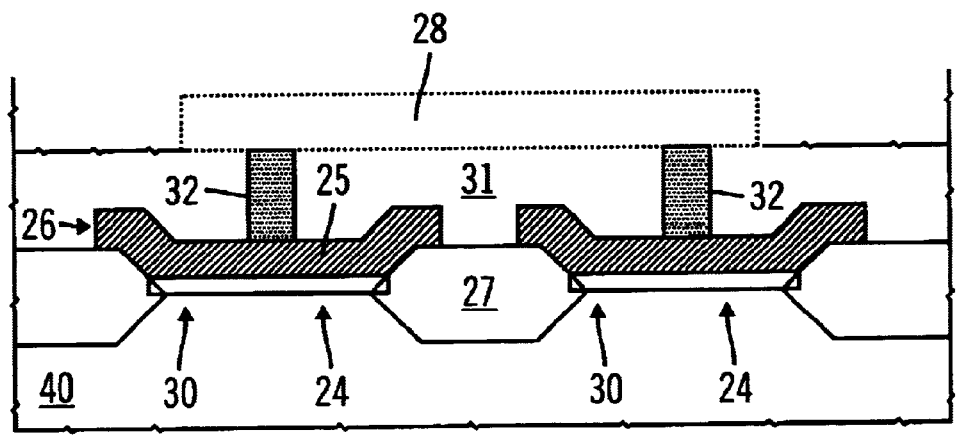
FIG. 6 is an enlarged vertical cross-section view, taken along line VI—VI in FIG. 3, showing schematically the first embodiment of the circuit structure according to the invention.

Each transistor has, in a known way, a source region 22 and a drain region 23 which are respectively formed by implanting a second dopant type, e.g. of the N type. Referring to FIG. 6, a channel region 24 is located in the substrate area included between the source region 22 and the drain region 23. A gate region 25, formed of a polysilicon layer 26, projects over the substrate surface, above the channel region 24. More particularly, the gate region 25 also extends over the isolation oxide 27 to prevent any misalignment occurring during the gate region formation steps from shorting the source and drain active areas of the transistor together. An intermediate oxide layer 31 is formed over the entire surface of the circuit structure 40. Respective contacts 32 are formed in the intermediate oxide layer 31. A conductive layer 28 is then formed for connecting electrically two gate regions through the contacts 32.

According to the invention, the contacts 32 are formed at the gate regions 25. As said before, this solution allows the occupation of silicon die area to be minimized, and is specially useful in circuit structures 40 where high voltage transistors are to be formed, as these transistors have the length of the transistor gate regions that is adequate to accommodate the contact 32 without problems from misalignment.

Advantageously in this invention, the gate regions 25 include a layer (not shown) of composites, comprising silicon and a transition metal such as titanium or tungsten, known as silicides. In particular, the silicide layer provided will minimize any mechanical stresses caused by the presence of the contact 32 at the active area region.

Figure 7:
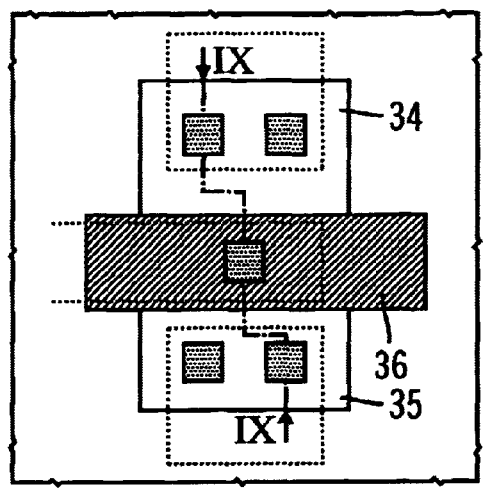
FIG. 7 is an enlarged top plan view showing schematically a portion of a semiconductor wherein a second embodiment of the circuit structure according to the invention has been formed.

FIG. 7 shows a second embodiment of the inventive which is entirely free of mechanical stresses. Referring to FIG. 7, a transistor 31 is formed in an active area 32, the active area 32 being provided in a layer 33 of isolation oxide. The transistor 31 has conventionally a source region 34 and drain region 35, each formed of an implant of the N type in the P-type substrate 40, for example. A channel region 36 locates in the substrate region extending from the source region 34 to the drain region 35. A gate region 37 projects over the substrate 40 surface, above the channel region 36. In detail, the gate region 37 comprises a first portion 38a, formed in a first polysilicon layer 38, which is partly overlaid by a second portion 39a formed from a dielectric layer 39. A third portion 40a, formed in a second polysilicon layer 40, fully covers the dielectric layer 39 and overlaps the first portion 38a. The dielectric layer 39 is electrically inactive, and the electric connection between the first gate region 38a and the second gate region 40a is provided by a short circuit being established in those portions of the gate regions 38a, 40a where no dielectric layer 39 is present. A layer 51 of intermediate oxide is formed over the entire surface of the circuit structure.

Figure 8:
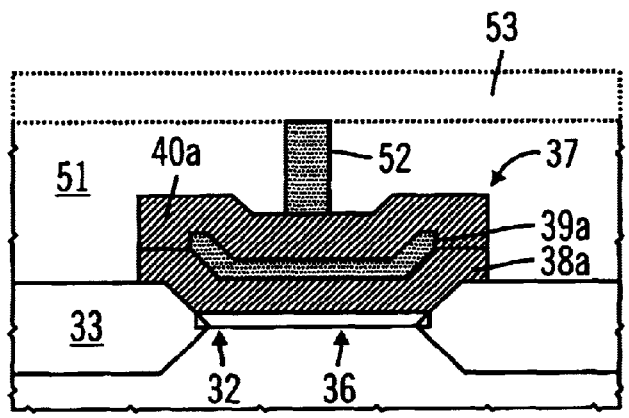
FIG. 8 is an enlarged vertical cross-section view, taken along line VIII—VIII in FIG. 7, showing schematically the second embodiment of the circuit structure according to the invention.
Figure 9:
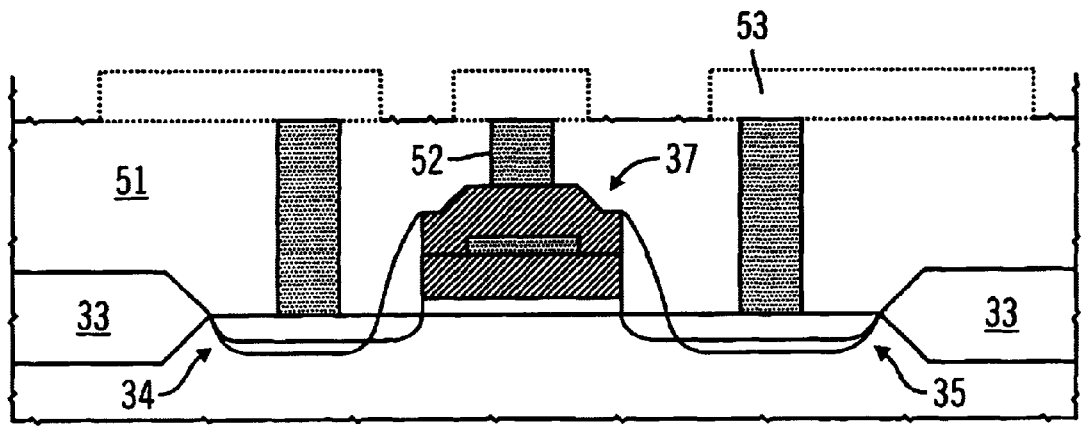
FIG. 9 is an enlarged vertical cross-section view, taken along line IX—IX in FIG. 7, showing schematically the second embodiment of the circuit structure according to the invention.

Referring to FIG. 8, a contact 52 is formed in the intermediate oxide layer 51. A conductive layer 53 is then formed for connecting the gate region electrically to other devices through the contact 52. The contact 52 is formed at the gate region 37. This embodiment is specially advantageous in that the dielectric layer acts as a damper between the contact and the oxide layer under the gate region. A specially advantageous embodiment for forming the contacts 32, 52 of structures according to the invention will now be described. The contacts 32 or 52 are formed by depositing, into openings through the intermediate dielectric layer, the same material that comprises the gate region 25 or 37, or the last layer thereof. For example, the contact 32 is formed of polysilicon if the gate region 25 is of polysilicon as shown in FIG. 6; the contact is formed of tungsten or titanium if the gate region comprises a silicide layer. Alternatively, the conductive material layer 28, 53, used for connecting the gate regions of the inventive structure electrically, may be formed of the same material as the contact 32 or 52, by merely continuing its deposition until a satisfactory step coverage is obtained and then defining the interconnections photolithographically. No real problem is encountered, not even where the resistivity of this conductive layer exceeds the low resistivity which is typical of aluminum or copper, since the interconnection provided by this process can be regarded as being "local", the "global" interconnections of the inventive structure being instead provided by other high-conductivity metal levels.

In addition, to prevent "over etching" through the material, such as polysilicon and/or polycide, which comprises the gate region, a contact fabrication process according to an embodiment of the invention comprises the following steps:

forming and re-oxidizing the gate regions;

A depositing a nitride layer (whereat a first portion of the contact-forming etch is to be stopped);

spacer forming;

depositing and planarizing (as by reflowing or CMP (Chemical-Mechanical Polishing) an intermediate dielectric layer;

defining the contact mask photolithographically;

contact etching by a high-selectivity process (such that the etch can be stopped at the nitride layer and cause no over etching of the gate regions which are covered with a smaller thickness of intermediate dielectric than the active areas, since the latter would lie at a greater depth);

completing the contact etching step by removing the residual layer of nitride and the underlying oxide, using conventional process steps which comprise, forming a barrier at the contact bottom, depositing and photolithographically defining a first metal layer, depositing and planarizing intermetal dielectric, opening vias, forming the last metal level, passivating, and opening pads.

This process minimizes the risk of damaging the gate oxide beneath the contact, since no process steps are introduced which might damage the gate materials.

We claim:

1. A circuit structure integrated in a semiconductor substrate and comprising:

at least one pair of transistors each formed in a respective active area region; and an isolation oxide region between the active area regions of the pair of transistors, wherein each transistor has a source region and a drain region and a channel region intervening between said source and drain regions being overlaid by a gate region, the gate regions of the pair of transistors are connected electrically together by an overlying conductive layer and respective contacts between the gate regions and the conductive layer, the contacts between the gate regions and the conductive layer each being formed directly above one of the active area regions, each gate region comprises a first portion formed in a first polysilicon layer, a second portion partly overlapping said first portion and formed in a dielectric layer, and a third portion formed in a second polysilicon layer, and said first and third portions are short-circuited.

2. The circuit structure of claim 1, wherein the contacts are formed in the middle of each gate region.

3. The circuit structure of claim 1, wherein each gate region comprises a silicide layer.

4. The circuit structure of claim 1, wherein each gate region comprises a first portion formed in a first polysilicon layer, a second portion partly overlapping said first portion and formed in a dielectric layer, and a third portion formed in a second polysilicon layer.

5. A circuit structure integrated in a semiconductor substrate and comprising:

at least one pair of transistors each formed in a respective active area region, wherein each transistor has a source region and a drain region and a channel region intervening between said source and drain regions being overlaid by a gate region, the gate regions of the pair of transistors are connected electrically together by an overlying conductive layer and respective contacts, the contacts between the gate regions and the conductive layer are formed above the active areas, each gate region comprises a first portion formed in a first polysilicon layer, a second portion partly overlapping said first portion and formed in a dielectric layer, and a third portion formed in a second polysilicon layer, and said first and third portions are short-circuited.

6. The circuit structure of claim 5, wherein said dielectric layer comprises oxide.

7. The circuit structure of claim 4, wherein said dielectric layer comprises oxide.

8. An information handling system including at least one circuit structure integrated in a semiconductor substrate and comprising:

at least one pair of transistors each formed in a respective active area region; and an isolation oxide region between the active area regions of the pair of transistors, wherein each transistor has a source region and a drain region and a channel region intervening between said source and drain regions being overlaid by a gate region, the gate regions of the pair of transistors are connected electrically together by an overlying conductive layer and respective contacts between the gate regions and the conductive layer, the contacts between the gate regions and the conductive layer each being formed directly above one of the active area regions, each gate region comprises a first portion formed in a first polysilicon layer, a second portion partly overlapping said first portion and formed in a dielectric layer, and a third portion formed in a second polysilicon layer, and said first and third portions are short-circuited.

9. The information handling system of claim 8, wherein the contacts are formed in the middle of each gate region.

10. The information handling system of claim 8, wherein each gate region comprises a silicide layer.

11. The information handling system of claim 8, wherein each gate region comprises a first portion formed in a first polysilicon layer, a second portion partly overlapping said first portion and formed in a dielectric layer, and a third portion formed in a second polysilicon layer.

12. An information handling system including a circuit structure integrated in a semiconductor substrate and comprising:

at least one pair of transistors each formed in a respective active area region, wherein each transistor has a source region and a drain region and a channel region intervening between said source and drain regions being overlaid by a gate region;

the gate regions of the pair of transistors are connected electrically together by an overlying conductive layer and respective contacts, the contacts between the gate regions and the conductive layer are formed above the active areas, each gate region comprises a first portion formed in a first polysilicon layer, a second portion partly overlapping said first portion and formed in a dielectric layer, and a third portion formed in a second polysilicon layer, and said first and third portions are short-circuited.

13. The information handling system of claim 12, wherein said dielectric layer comprises oxide.

14. The information handling system of claim 11, wherein said dielectric layer comprises oxide.

15. The circuit structure of claim 1, wherein the channel regions of the pair of transistors are both the same conductivity type.

16. The circuit structure of claim 1, wherein the gate regions of the pair of transistors are formed from a polysilicon line, and the polysilicon line is interrupted to divide the polysilicon line into two sections such that the gate regions of the pair of transistors are not directly connected together.

17. The circuit structure of claim 8, wherein the channel regions of the pair of transistors are both the same conductivity type.

18. A circuit structure integrated in a semiconductor substrate and comprising:

at least one pair of transistors each formed in a respective active area region, wherein each transistor has a source region and a drain region and a channel region intervening between said source and drain regions being overlaid by a gate region, the channel regions of the pair of transistors are both the same conductivity type, the gate regions of the pair of transistors are connected electrically together by an overlying conductive layer and respective contacts between tie gate regions and the conductive layer, the contacts between the gate regions and the conductive layer each being formed directly above one of the active area regions, each gate region comprises a first portion formed in a first polysilicon layer, a second portion partly overlapping said first portion and formed in a dielectric layer, and a third portion formed in a second polysilicon layer, and said first and third portions are short-circuited.

19. The circuit structure of claim 18, wherein the gate regions of the pair of transistors are formed from a polysilicon line, and the polysilicon line is interrupted so as to divide the polysilicon line into two sections such that the gate regions of the pair of transistors are not directly connected together.

20. The circuit structure of claim 1, wherein the conductive layer is separated from the gate regions by only a single dielectric layer so that each of the contacts extends from one of the gate regions above one of the active area regions through only the single dielectric layer to the conductive layer.

21. The circuit structure of claim 1, wherein the pair of transistors are two adjacent transistors formed on the same level of an integrated circuit, and the conductive layer only provides a local interconnection between the gate regions of the two adjacent transistors.

22. The circuit structure of claim 1, wherein the contacts are formed of the same material as the gate regions if the gate regions each consist of a single layer, and the contacts are formed of the same material as an uppermost layer of the gate regions if the gate regions include more than one layer.

23. The circuit structure of claim 22, wherein the conductive layer is formed of the same material as the contacts.

* * * * *